(12) United States Patent
Daimon et al.

(10) Patent No.: US 12,425,001 B2
(45) Date of Patent: Sep. 23, 2025

(54) ACOUSTIC WAVE DEVICE AND LADDER FILTER

(71) Applicant: Murata Manufacturing Co., Ltd., Nagaokakyo (JP)

(72) Inventors: Katsuya Daimon, Nagaokakyo (JP); Sho Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 271 days.

(21) Appl. No.: 18/137,631

(22) Filed: Apr. 21, 2023

(65) Prior Publication Data
US 2023/0261634 A1    Aug. 17, 2023

Related U.S. Application Data

(63) Continuation of application No. PCT/JP2021/045960, filed on Dec. 14, 2021.

(30) Foreign Application Priority Data

Dec. 18, 2020 (JP) ................................. 2020-210371

(51) Int. Cl.
*H03H 9/02* (2006.01)
*H03H 9/145* (2006.01)
(Continued)

(52) U.S. Cl.
CPC .... *H03H 9/02992* (2013.01); *H03H 9/02866* (2013.01); *H03H 9/145* (2013.01); *H03H 9/25* (2013.01); *H03H 9/6483* (2013.01)

(58) Field of Classification Search
CPC ........... H03H 9/02992; H03H 9/02866; H03H 9/145; H03H 9/25; H03H 9/6483;
(Continued)

(56) References Cited

U.S. PATENT DOCUMENTS 10,812,039 B2 * 10/2020 Iwaki ................. H03H 9/02834
2019/0123713 A1    4/2019 Daimon
(Continued)

FOREIGN PATENT DOCUMENTS

JP    2019080093 A    5/2019
JP    2020188408 A    11/2020
(Continued)

OTHER PUBLICATIONS

International Search Report in PCT/JP2021/045960, mailed Mar. 1, 2022, 3 pages.
(Continued)

*Primary Examiner* — John W Poos
(74) *Attorney, Agent, or Firm* — Keating & Bennett, LLP

(57) ABSTRACT

In an acoustic wave device, a piezoelectric layer is provided directly or indirectly on a support substrate, an IDT electrode is provided on the piezoelectric layer, an overlap region includes a middle region and first and second edge regions, and first and second conductive layers are provided on a second main surface of the piezoelectric layer to overlap at least some portions of the first and second edge regions in plan view and at least some portions of first and second busbars in plan view.

20 Claims, 12 Drawing Sheets

(51) Int. Cl.
*H03H 9/25* (2006.01)
*H03H 9/64* (2006.01)

(58) Field of Classification Search
CPC .......... H03H 9/02858; H03H 9/02881; H03H 9/02574; H03H 9/14541
See application file for complete search history.

(56) References Cited

U.S. PATENT DOCUMENTS

| | | | |
|---|---|---|---|
| 2019/0379353 A1* | 12/2019 | Nakahashi | H03H 9/725 |
| 2020/0304097 A1* | 9/2020 | Suzuki | H03H 9/64 |
| 2020/0366270 A1* | 11/2020 | Matsuoka | H03H 9/02275 |
| 2021/0175872 A1 | 6/2021 | Daimon | |
| 2021/0265972 A1* | 8/2021 | Daimon | H03H 9/02574 |
| 2021/0408995 A1 | 12/2021 | Okunaga | |
| 2022/0029601 A1 | 1/2022 | Nagatomo | |

FOREIGN PATENT DOCUMENTS

| | | |
|---|---|---|
| WO | 2020045442 A1 | 3/2020 |
| WO | 2020184466 A1 | 9/2020 |
| WO | 2020209359 A1 | 10/2020 |

OTHER PUBLICATIONS

Written Opinion in PCT/JP2021/045960, mailed Mar. 1, 2022, 3 pages.
Office Action in JP2022-570001, dated May 14, 2024, 4 pages.

* cited by examiner

ACOUSTIC WAVE DEVICE AND LADDER FILTER

CROSS REFERENCE TO RELATED APPLICATIONS

This application claims the benefit of priority to Japanese Patent Application No. 2020-210371 filed on Dec. 18, 2020 and is a Continuation Application of PCT Application No. PCT/JP2021/045960 filed on Dec. 14, 2021. The entire contents of each application are hereby incorporated herein by reference.

BACKGROUND OF THE INVENTION

1. Field of the Invention

The present invention relates to an acoustic wave device in which an overlap region of an IDT electrode includes a middle region and first and second edge regions located on both outer sides of the middle region and a ladder filter including the acoustic wave device.

2. Description of the Related Art

The acoustic wave device described in International Publication No. 2020/184466 includes a silicon oxide film, an acoustic velocity adjustment film, a piezoelectric film, and an IDT electrode that are laminated together on a support substrate. The IDT electrode includes an overlap region in which the plurality of first electrode fingers and a plurality of second electrode fingers overlap each other in an acoustic wave propagation direction. The overlap region includes a middle region and first and second edge regions disposed on both outer sides in the direction in which the first and second electrode fingers extend. In International Publication No. 2020/184466, an acoustic velocity adjustment film is provided to adjust the acoustic velocity. This acoustic velocity adjustment film is not laminated on the IDT electrode. Accordingly, the acoustic velocity can be adjusted with high accuracy and acoustic loss can be suppressed.

SUMMARY OF THE INVENTION

In the acoustic wave device described in International Publication No. 2020/184466, the acoustic velocity can be adjusted with high accuracy and acoustic loss can be suppressed, but the fractional band width cannot be easily reduced in the case of, for example, a resonator. In addition, in a band-pass filter having a plurality of such acoustic wave devices, it is sometimes difficult to reduce the band width and increase the steepness.

Preferred embodiments of the present invention provide acoustic wave devices and ladder filters that each can reduce a fractional band width in a case of an acoustic wave resonator and that can reduce a band width and increase a steepness when used in a band-pass filter.

According to a preferred embodiment of the present invention, an acoustic wave device includes a support substrate, a piezoelectric layer provided directly or indirectly on the support substrate, the piezoelectric layer including a first main surface and a second main surface that face away from each other, the second main surface being closer to the support substrate, and an IDT electrode provided on the first main surface of the piezoelectric layer, in which the IDT electrode includes a first comb electrode including a plurality of first electrode fingers and a first busbar and a second comb electrode including a plurality of second electrode fingers interdigitated with the plurality of first electrode fingers and a second busbar, a region in which the first electrode fingers and the second electrode fingers overlap each other in a direction perpendicular or substantially perpendicular to the first electrode fingers and the second electrode fingers is an overlap region, the overlap region includes a middle region located centrally in a direction in which the first electrode fingers and the second electrode fingers extend, a first edge region located on an outer side of the middle region in the direction in which the first electrode fingers and the second electrode fingers extend, the first edge region being closer to the first busbar, and a second edge region located on the outer side of the middle region in the direction in which the first electrode fingers and the second electrode fingers extend, the second edge region being closer to the second busbar, a first gap region is present between the first busbar and the first edge region, a second gap region is present between the second busbar and the second edge region, and the acoustic wave device further includes a conductive layer that is provided on the second main surface of the piezoelectric layer to overlap at least some portions of the first and second edge regions in plan view and at least some portions of the first and second busbars in plan view.

According to preferred embodiments of the present invention, a ladder filter includes at least one series arm resonator, and at least one parallel arm resonator, in which at least one of the at least one series arm resonator includes the acoustic wave device according to a preferred embodiment of the present invention.

According to another aspect of a preferred embodiment of the present invention, a ladder filter includes a plurality of series arm resonators, and at least one parallel arm resonator, in which a series arm resonator with a lowest resonant frequency among the plurality of series arm resonators includes the acoustic wave device according to a preferred embodiment of the present invention.

In the acoustic wave devices according to preferred embodiments of the present invention, the fractional band width of the acoustic wave resonator can be reduced and, in the ladder filter including the acoustic wave device according to a preferred embodiment of the present invention, regarding filter characteristics, the band width can be reduced and the steepness can be increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing specific preferred embodiments of the present invention with reference to the drawings.

It should be noted that the preferred embodiments described in this specification are exemplary and that partial replacement or combinations of the structures of different preferred embodiments are possible.

Figure 1A:
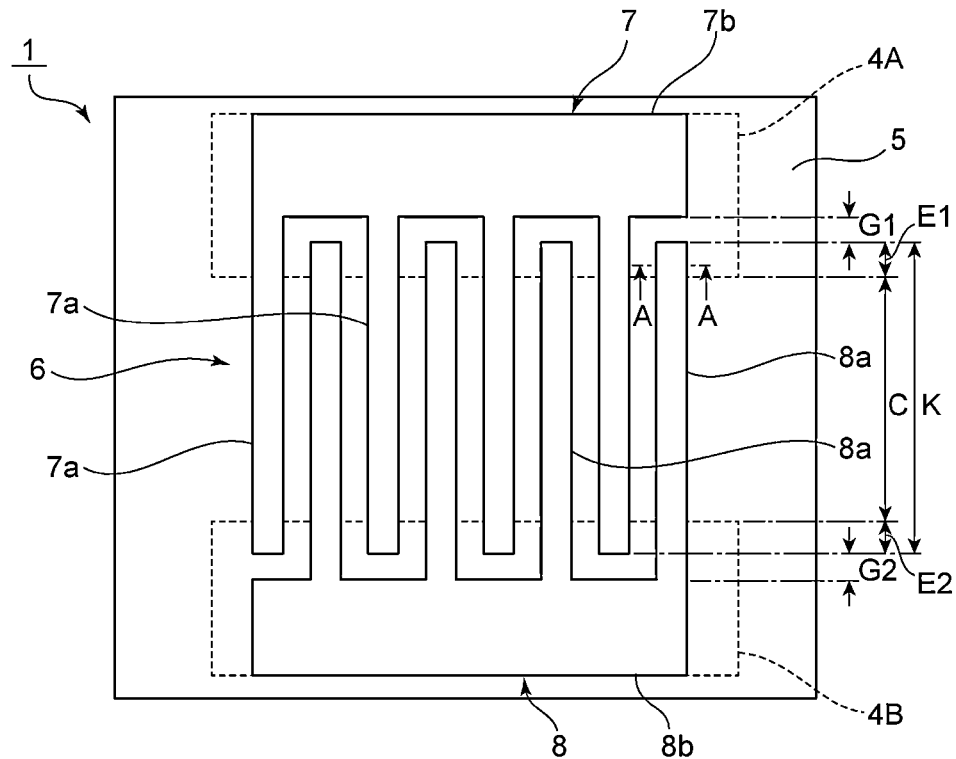
FIG. 1A is a plan view of an acoustic wave device according to a first preferred embodiment of the present invention.
Figure 1B:
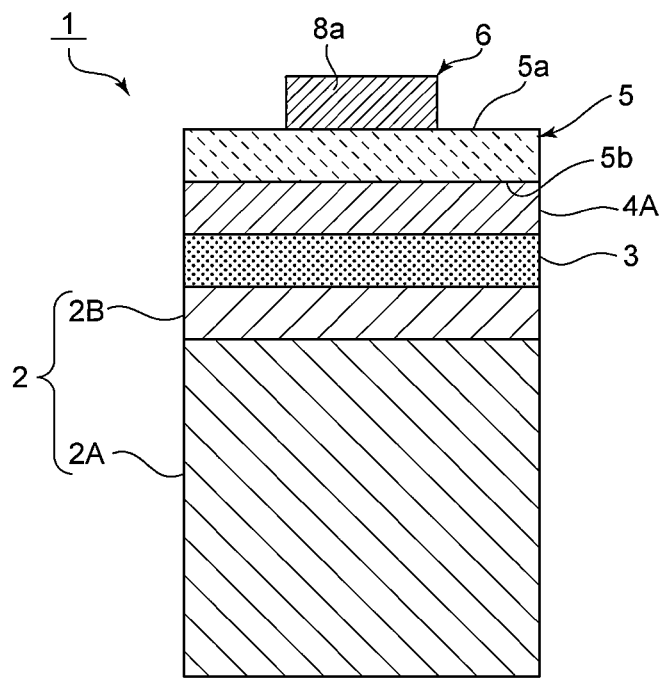
FIG. 1B is a sectional view taken along line A-A in FIG. 1A.

FIG. 1A is a plan view of an acoustic wave device according to a first preferred embodiment of the present invention, and FIG. 1B is a sectional view taken along line A-A in FIG. 1A.

An acoustic wave device 1 includes a support substrate 2. The support substrate 2 according to the present preferred embodiment includes a Si substrate 2A and a high-acoustic-velocity film 2B but may be a single-layer substrate made of other insulating materials or semiconductor materials. The high-acoustic-velocity film 2B made of silicon nitride is laminated on the Si support substrate 2A. A low-acoustic-velocity film 3 made of silicon oxide is laminated on the high-acoustic-velocity film 2B. First and second conductive layers 4A and 4B are laminated on the low-acoustic-velocity film 3. A piezoelectric layer 5 made of LiTaO₃ is laminated on the first and second conductive layers 4A and 4B. It should be noted that the low-acoustic-velocity film 3 is an intermediate layer. However, the intermediate layer may be a laminated film including the low-acoustic-velocity film 3.

The piezoelectric layer 5 includes a first main surface 5a and a second main surface 5b that face away from each other. An IDT electrode 6 is laminated on the first main surface 5a. The piezoelectric layer 5 is laminated on the first and second conductive layers 4A and 4B with the second main surface 5b facing the first and second conductive layers 4A and 4B. The low-acoustic-velocity film 3 is made of a low-acoustic-velocity material. The acoustic velocity of a bulk wave that propagates through the low-acoustic-velocity material is lower than the acoustic velocity of a bulk wave that propagates through the piezoelectric layer 5. The high-acoustic-velocity film 2B is made of a high-acoustic-velocity material. The acoustic velocity of a bulk wave that propagates through the high-acoustic-velocity material is higher than the acoustic velocity of an acoustic wave that propagates through the piezoelectric layer 5.

The IDT electrode 6 includes a first comb electrode 7 and a second comb electrode 8. The first comb electrode 7 includes a plurality of first electrode fingers 7a and a first busbar 7b. Ends of the first electrode fingers 7a are coupled to the first busbar 7b.

The second comb electrode 8 includes a plurality of second electrode fingers 8a and a second busbar 8b. Ends of the second electrode fingers 8a are coupled to the second busbar 8b.

The plurality of first electrode fingers 7a and the plurality of second electrode fingers 8a are interdigitated with each other. The first electrode fingers 7a extend toward the second busbar 8b, and the second electrode fingers 8a extend toward the first busbar 7b. The first electrode fingers 7a and the second electrode fingers 8a are disposed parallel or substantially parallel to each other.

Figure 2:
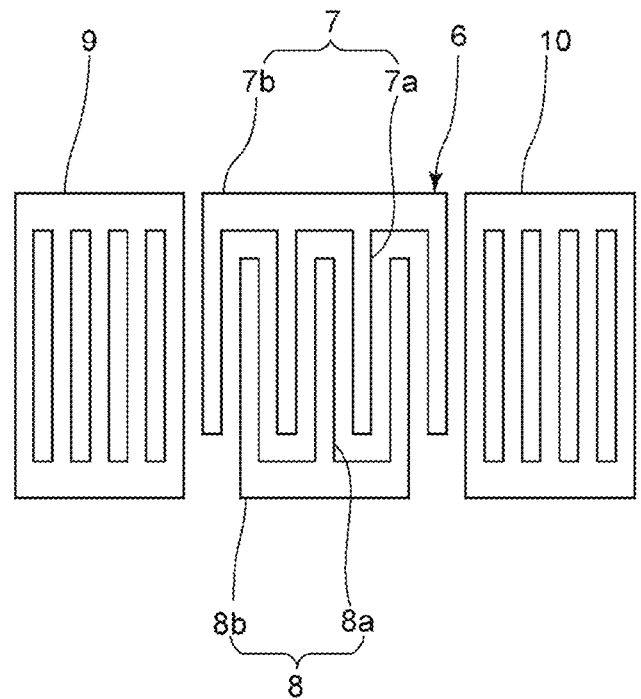
FIG. 2 is a schematic plan view illustrating the electrode structure of the acoustic wave device according to the first preferred embodiment of the present invention.

FIG. 2 is a plan view schematically illustrating the electrode structure of the acoustic wave device according to the first preferred embodiment. In the acoustic wave device 1, reflectors 9 and 10 are provided on both sides in the acoustic wave propagation direction of the IDT electrode 6. These components define a one-port acoustic wave resonator.

In the acoustic wave device 1, application of an AC voltage across the first comb electrode 7 and the second comb electrode 8 excites an acoustic wave. In this case, the acoustic wave propagates in a direction perpendicular or substantially perpendicular to the direction in which the plurality of first electrode fingers 7a and the plurality of second electrode fingers 8a extend. The region in which the first electrode fingers 7a and the second electrode fingers 8a overlap each other in the direction orthogonal to the direction in which the first and second electrode fingers 7a and 8a extend, that is, in the acoustic wave propagation direction, is referred to as an overlap region K. An acoustic wave is excited in the overlap region K. This overlap region K includes a middle region C and a first edge region E1 and a second edge region E2 that are disposed on the outer side in the direction in which the first and second electrode fingers 7a and 8a extend. The first edge region E1 is disposed closer to the first busbar 7b than the middle region C. The second edge region E2 is disposed closer to the second busbar 8b than the middle region C.

The IDT electrode 6 is made of an appropriate metal or alloy. In the present preferred embodiment, the IDT electrode 6 is formed of a multilayer body including a Ti film, an Al film, and a Ti film.

A first gap region G1 is present between the first edge region E1 and the first busbar 7b, and a second gap region G2 is present between the second edge region E2 and the second busbar 8b.

The acoustic wave device 1 includes the first and second conductive layers 4A and 4B. The first and second conductive layers 4A and 4B are provided on the second main surface 5b side of the piezoelectric layer 5. It should be noted that "provided on the second main surface 5b side" indicates not only being provided directly on the second main surface 5b, but also being provided indirectly on the second main surface 5b via other layers.

The first and second conductive layers 4A and 4B overlap at least some portions of the first and second edge regions E1 and E2, respectively. Furthermore, the first and second conductive layers 4A and 4B are disposed to overlap at least some portions of the first and second busbars 7b and 8b, respectively. It should be noted that the first and second conductive layers 4A and 4B are not electrically connected to the first and second busbars 7b and 8b.

As illustrated in FIG. 1A, on the first edge region E1 side, the first conductive layer 4A is provided so as to extend from the first edge region E1 to a portion below the first busbar 7b. That is, the first conductive layer 4A is provided so as to extend to the first gap region G1 as well. Similarly, on the second edge region E2 side, the second conductive layer 4B is provided so as to extend from the second edge region E2 to a portion below the second busbar 8b beyond the second gap region G2. The first conductive layer 4A and the second conductive layer 4B are not provided in the middle region C.

It should be noted that, as illustrated in FIG. 1A, the first and second conductive layers 4A and 4B extend from one end in the acoustic wave propagation direction of the IDT electrode 6 toward the other end. Preferably, the first and second conductive layers 4A and 4B are provided to include a region from one end to the other end of the overlap region K in the acoustic wave propagation direction.

Since the acoustic wave device 1 has the first and second conductive layers 4A and 4B, the acoustic velocity in the first and second edge regions E1 and E2 is lower than the acoustic velocity in the middle region C due to the mass addition effect of the first and second conductive layers 4A and 4B. In addition, the acoustic velocity in the first and second gap regions G1 and G2 is higher than the acoustic velocity in the first and second edge regions E1 and E2. Accordingly, a transverse mode can be suppressed by a piston mode. In addition, the first conductive layer 4A or the second conductive layer 4B overlaps the first busbar 7b or the second busbar 8b via the piezoelectric layer 5.

Accordingly, a capacitance is generated between the first busbar 7b or the second busbar 8b and the first conductive layer 4A or the second conductive layer 4B. Accordingly, the fractional band width can be smaller. This will be clarified by describing the characteristics of example 1 and comparative example 1 below.

The following acoustic wave device has been created as the acoustic wave device 1 according to example 1 of the first preferred embodiment.

Support substrate 2: (100)-oriented Si substrate 2A. The high-acoustic-velocity film 2B is a silicon nitride film having a thickness of 900 nm.

Low-acoustic-velocity film 3: Silicon oxide film having a thickness of 600 nm

First and second conductive layers 4A and 4B: Pt films having a thickness of 6 nm Piezoelectric layer 5: LiTaO$_3$ film having a thickness of 600 nm IDT electrode 6: multilayer body including a Ti film, an Al film, and a Ti film with film thicknesses of 12 nm, 140 nm, and 12 nm, respectively, in order from the piezoelectric layer 5 side.

Overlap width=40 μm

Length of middle region C=37.6 μm

Dimensions in the direction in which first and second electrode fingers 7a and 8a of first and second edge regions E1 and E2 extend: 1.2 μm Area of first busbar 7b and second busbar 8b=4×10$^{-8}$ m$^2$ Area in which first conductive layer 4A overlaps first busbar 7b and second conductive layer 4B overlaps second busbar 8b via piezoelectric layer 5=1.5×108 m$^2$ Pitch of electrode fingers of IDT electrode 6=1 μm Number of pairs of electrode fingers=100 pairs The reflectors are provided in the acoustic wave propagation direction of the IDT electrode 6 (not illustrated). These components constitute the acoustic wave device according to example 1 as a one-port acoustic wave resonator.

An acoustic wave device according to comparative example 1 has been manufactured in the same way as example 1 except that a Pt film is disposed only below the first and second edge regions E1 and E2 for comparison.

It should be noted that the designed resonant frequency is about 1955 MHz.

Figure 3:
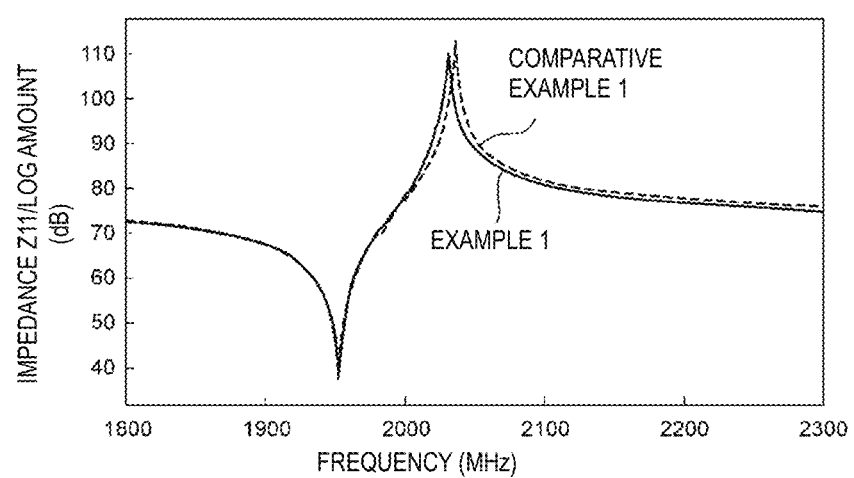
FIG. 3 is a diagram illustrating the impedance-frequency characteristics of acoustic wave devices according to example 1 and comparative example 1.

As is clear from FIG. 3, the fractional band width in example 1 is reduced more than the fractional band width in comparative example 1. This is considered to be due to the generation of a parallel capacitance between the first conductive layer 4A or the second conductive layer 4B and the first busbar 7b or the second busbar 8b. Accordingly, the acoustic wave device 1 not only suppresses the transverse mode, but also provides an acoustic wave resonator having a small fractional band width. Therefore, when a band-pass filter includes such an acoustic wave device, the band width of the filter characteristics can be reduced and the steepness of the filter characteristics can be increased.

Figure 4:
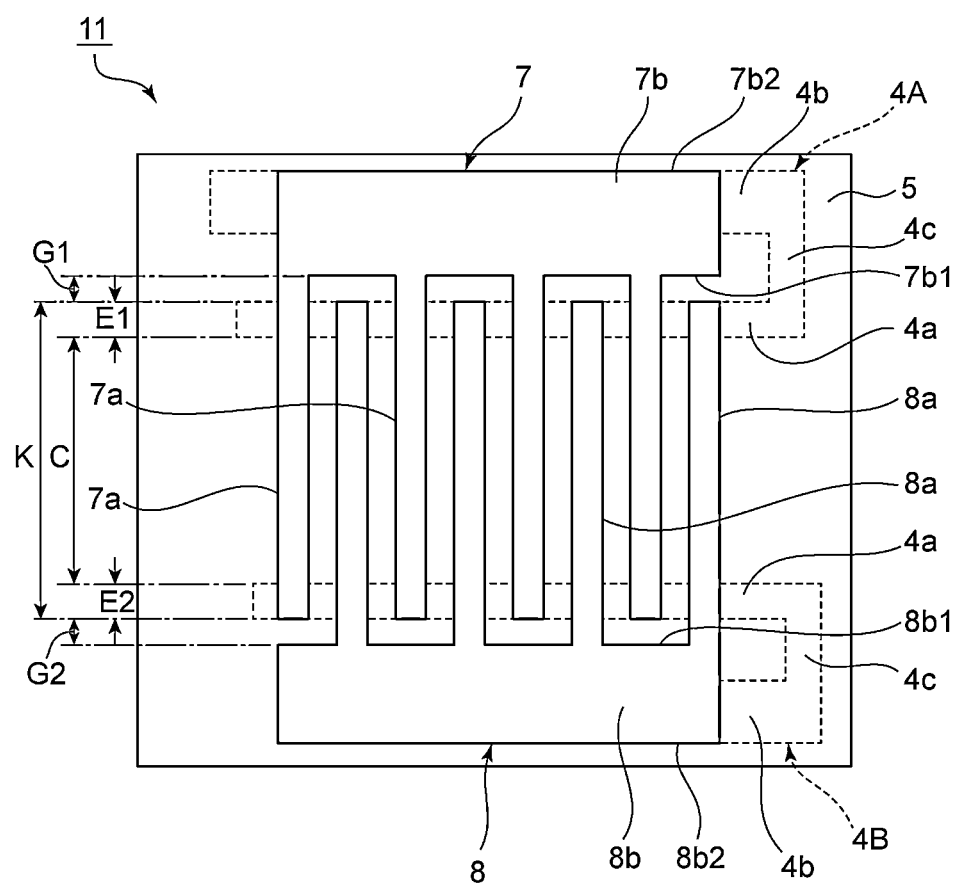
FIG. 4 is a plan view of an acoustic wave device according to a second preferred embodiment of the present invention.

FIG. 4 is a plan view of an acoustic wave device according to a second preferred embodiment of the present invention.

In the acoustic wave device 11, the planar shape of the first conductive layer 4A differs from that of the acoustic wave device 1. That is, on the first edge region E1 side, the first conductive layer 4A is provided in the first edge region E1 and includes a first portion 4a extending in the acoustic wave propagation direction, a second portion 4b extending in the acoustic wave propagation direction below the first busbar 7b, and a third portion 4c that is a coupling portion coupling the first portion 4a and the second portion 4b to each other on the outer side in the acoustic wave propagation direction of the overlap region K. The second conductive layer 4B having a similar structure is provided in the second edge region E2.

As described above, the first and second conductive layers 4A and 4B need not be present below the first gap region G1 or the second gap region G2.

In addition, in the acoustic wave device 11, the inner-side edge of the second portion 4b of the first conductive layer 4A is located on the outer side of an inner-side edge 7b1 of the first busbar 7b in the direction in which the first and second electrode fingers 7a and 8a extend with respect to the overlap region K. In addition, below the second busbar 8b, the inner-side edge of the second portion 4b of the second conductive layer 4B is located on the outer side of an inner-side edge 8b1 of the second busbar 8b in the direction in which the first and second electrode fingers 7a and 8a extend with respect to the overlap region K.

As described above, the conductive layer portion that overlaps the first busbar 7b or the second busbar 8b via the piezoelectric layer 5 need not be present below the entire surface of the first busbar 7b or the second busbar 8b.

In addition, the second portion 4b is provided so as to extend to a lower portion of an outer-side edge 7b2 of the first busbar 7b or an outer-side edge 8b2 of the second busbar 8*b*, but the second portion 4*b* may be located closer to the overlap region K than the outer-side edge 7*b*2 or the outer-side edge 8*b*2.

That is, the conductive layer can generate a capacitance between the conductive layer and the first busbar or between the conductive layer and the second busbar only if the conductive layer is disposed to overlap at least a portion of the first busbar or the second busbar.

In addition, the entire regions of the first and second conductive layers 4A and 4B need not be laminated on all the first and second edge regions E1 and E2 via the piezoelectric layer 5. That is, the first and second conductive layers 4A and 4B need only be laminated on at least some portions of the first and second edge regions E1 and E2.

Figure 5:
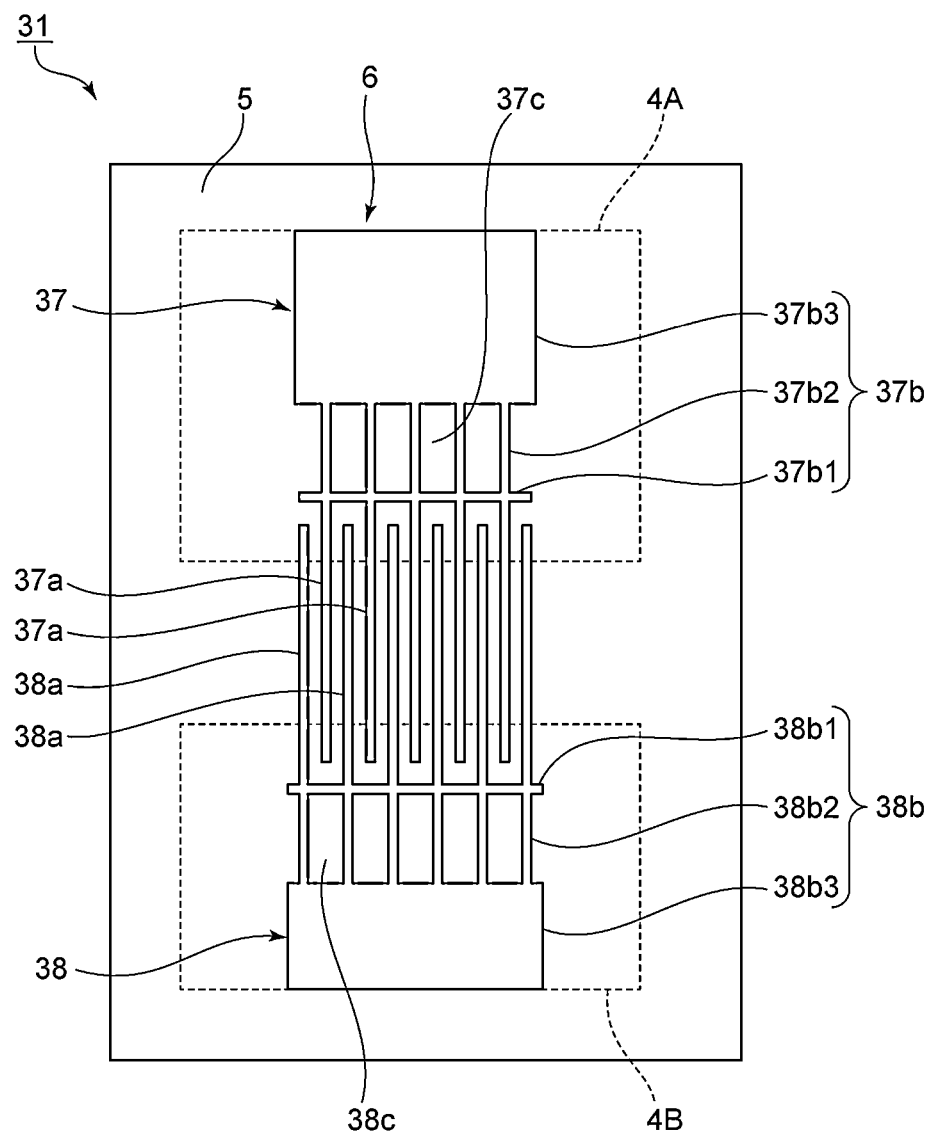
FIG. 5 is a plan view of an acoustic wave device according to a third preferred embodiment of the present invention.

FIG. 5 is a plan view of an acoustic wave device according to a third preferred embodiment of the present invention. In the acoustic wave device 31, the IDT electrode 6 includes the first comb electrode 37 and the second comb electrode 38. The first comb electrode 37 includes a plurality of first electrode fingers 37*a* and a first busbar 37*b*. In the acoustic wave device 31, the first busbar 37*b* includes an inner-side busbar 37*b*1 disposed on the inner side, an outer-side busbar 37*b*3 disposed on the outer side, and coupling portions 37*b*2 that couple the inner-side busbar 37*b*1 and the outer-side busbar 37*b*3 to each other. It should be noted that "the inner side" is the side close to the overlap region K. Cavity portions 37*c* are provided between the coupling portions 37*b*2 in the acoustic wave propagation direction. Similarly, the second comb-teeth electrode 38 includes a plurality of second electrode fingers 38*a* and a second busbar 38*b*. As in the first busbar 37*b*, the second busbar 38*b* includes an inner-side busbar 38*b*1, an outer-side busbar 38*b*3, and coupling portions 38*b*2. In addition, a plurality of cavity portions 38*c* are provided in the acoustic wave propagation direction.

The structure of the acoustic wave device 31 is the same as that of the acoustic wave device 1 except that the first busbar 37*b* and the second busbar 38*b* are configured as described above. As described above, in a preferred embodiment of the present invention, each of the first and second busbars may have a structure in which an inner-side busbar, an outer-side busbar, and coupling portions are provided. In this case as well, the fractional band width can be reduced by providing the first and second conductive layers 4A and 4B.

Figure 6:
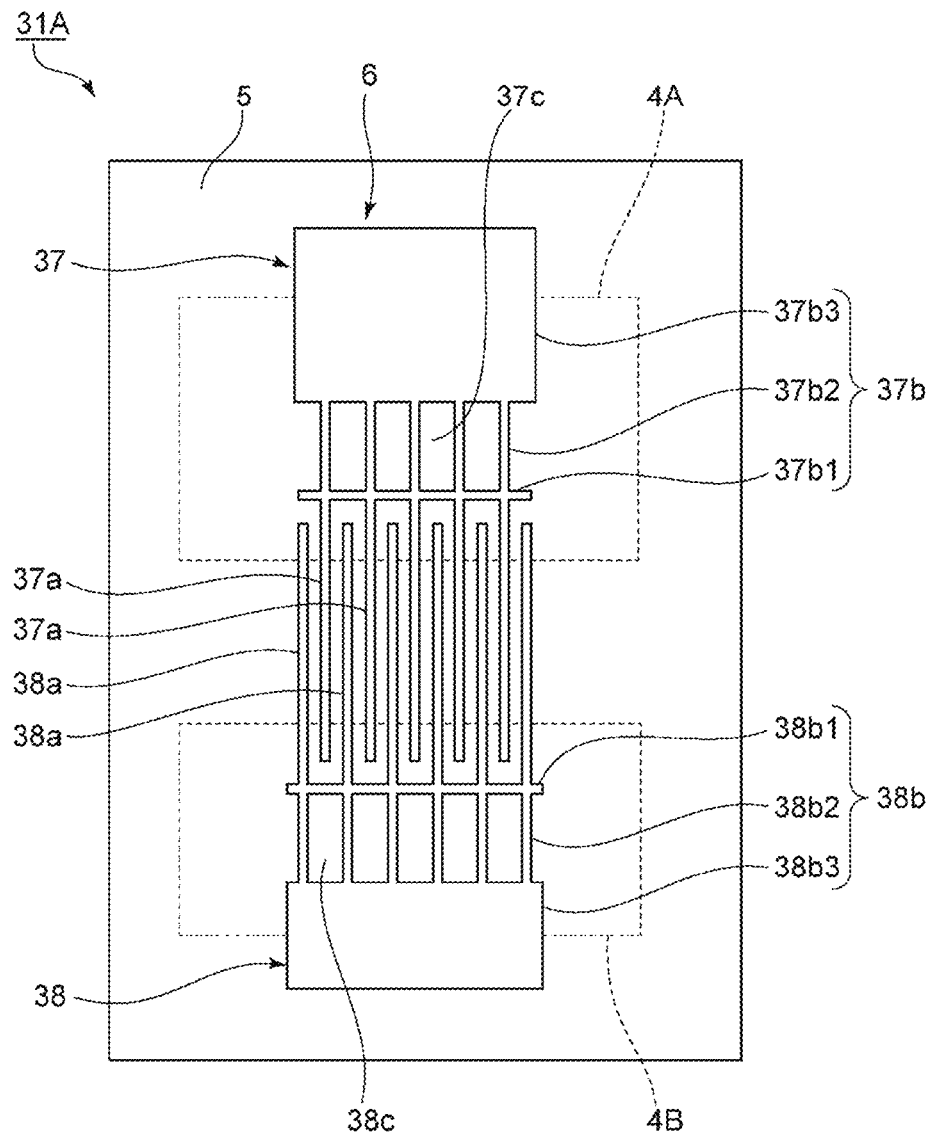
FIG. 6 is a plan view of an acoustic wave device according to a modification of the third preferred embodiment of the present invention.

FIG. 6 is a plan view of an acoustic wave device according to a modification of the third preferred embodiment of the present invention. As illustrated in FIG. 6, in an acoustic wave device 31A according to the present modification, the edges of the first and second conductive layers 4A and 4B on the opposite side of the overlap region K are located closer to the overlap region K than the outer-side edges of the first and second busbars 37*b* and 38*b* with respect to the overlap region K.

As described above, the edges of the first and second conductive layers on the opposite side of the overlap region K may be present on the inner side of the outer-side edges of the first and second busbars.

Figure 7A:
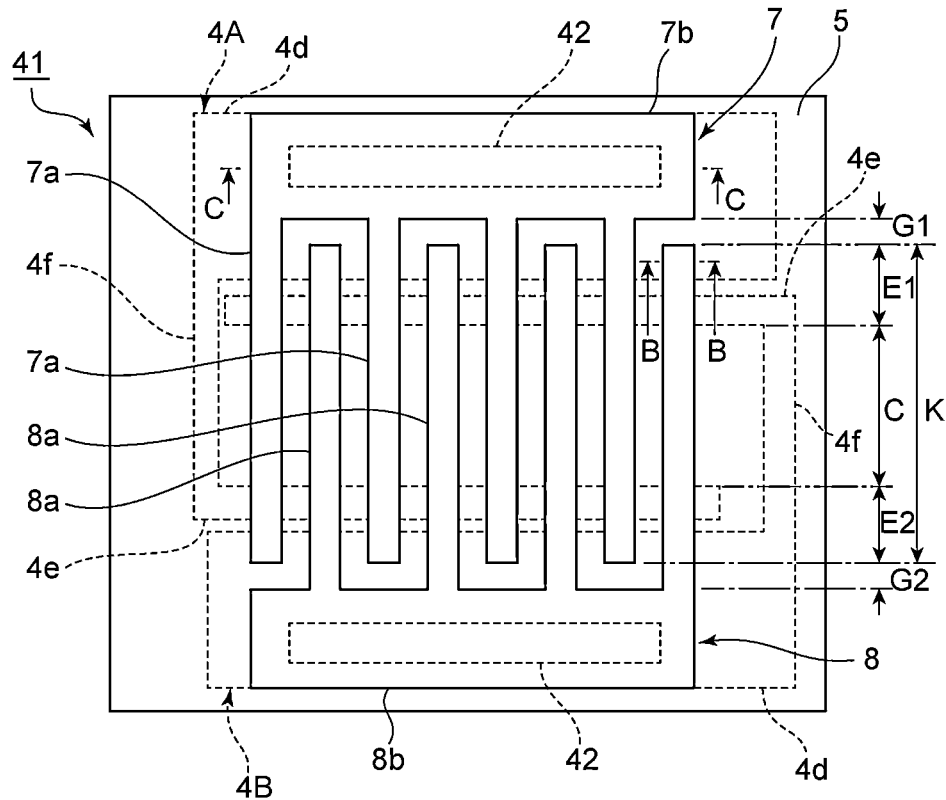
FIG. 7A is a plan view of an acoustic wave device according to a fourth preferred embodiment of the present invention.
Figure 7B:
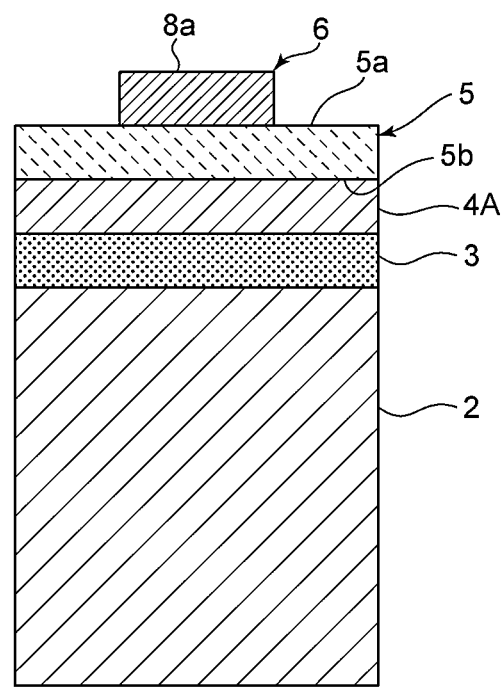
FIG. 7B is a sectional view taken along line B-B in FIG. 7A.
Figure 8:
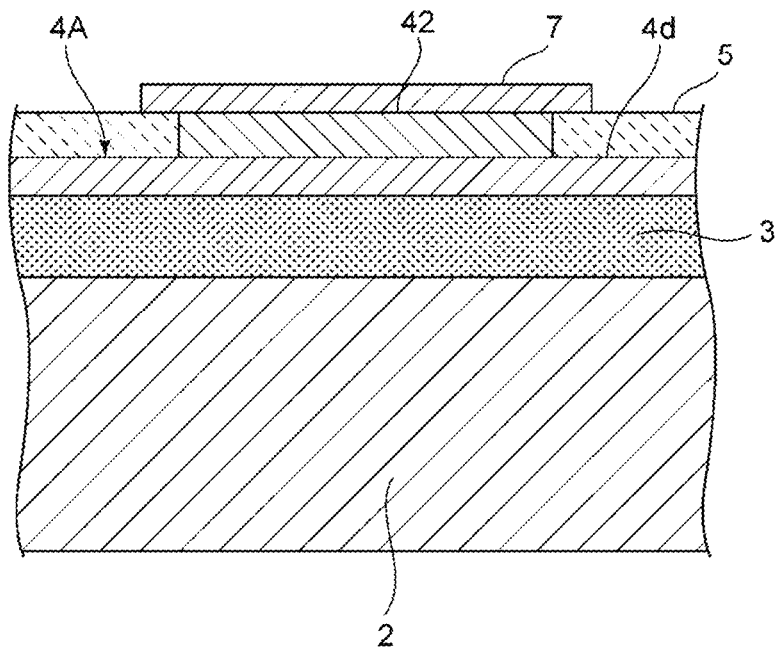
FIG. 8 is an enlarged sectional view taken along line C-C in FIG. 7A.

FIG. 7A is a plan view of an acoustic wave device according to a fourth preferred embodiment of the present invention, and FIG. 7B is a sectional view taken along line B-B in FIG. 7A. FIG. 8 is an enlarged sectional view taken along line C-C in FIG. 7A.

In the acoustic wave device 41, on the first busbar 7*b* side, the first conductive layer 4A has a first portion 4*d* that overlaps the first busbar 7*b* via the piezoelectric layer 5 and extends to the first gap region G1 and an intermediate portion of the first edge region E1. A second portion 4*e* is provided in the second edge region E2 so as to extend parallel to this first portion 4*d*. The first portion 4*d* and the second portion 4*e* are coupled to each other by a third portion 4*f*. The third portion 4*f* extends in the direction in which the first and second electrode fingers 7*a* and 8*a* extend and is located on the outer side in the acoustic wave propagation direction of the overlap region K.

Similarly, the second conductive layer 4B, which overlaps the second busbar 8*b*, includes the first portion 4*d*, the second portion 4*e*, and the third portion 4*f*. The second portion 4*e* extends in the acoustic wave propagation direction within the first edge region E1.

The first conductive layer 4A is electrically connected to the first busbar 7*b* via a through-hole electrode 42. As illustrated in a partially enlarged sectional view in FIG. 8, the through-hole electrode 42 is provided so as to pass through the piezoelectric layer 5. On the second busbar 8*b* side as well, the second busbar 8*b* is electrically connected to the second conductive layer 4B via the through-hole electrode 42.

As described above, in a preferred embodiment of the present invention, the first conductive layer 4A may further include the second portion 4*e* that overlaps the second edge region E2, and similarly, the second conductive layer 4B may further include a portion that overlaps the first edge region E1.

It should be noted that, in the first edge region E1, the first portion 4*d* of the first conductive layer 4A and the second portion 4*e* of the second conductive layer 4B are separated from each other in a direction perpendicular or substantially perpendicular to the acoustic wave propagation direction. Similarly, the second portion 4*e* of the first conductive layer 4A and the first portion 4*d* of the second conductive layer 4B are separated from each other by the second edge region E2.

As described above, when the second portion 4*e* is disposed in each of the first conductive layer 4A and the second conductive layer 4B, the fractional band width can be more effectively reduced by further adding a capacitance.

An acoustic wave device according to example 2 is configured as the acoustic wave device according to the fourth preferred embodiment.

Figure 9:
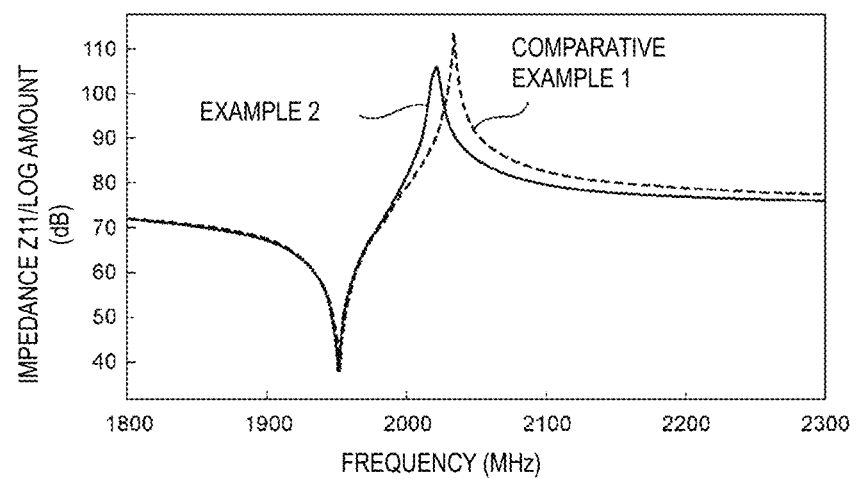
FIG. 9 is a diagram illustrating the impedance-frequency characteristics of acoustic wave devices according to example 2 and comparative example 1.

FIG. 9 illustrates the impedance-frequency characteristics of the acoustic wave devices according to example 2 and comparative example 1.

As is clear from FIG. 9, the fractional band width can be sufficiently reduced in example 2 compared with comparative example 1.

Figure 10:
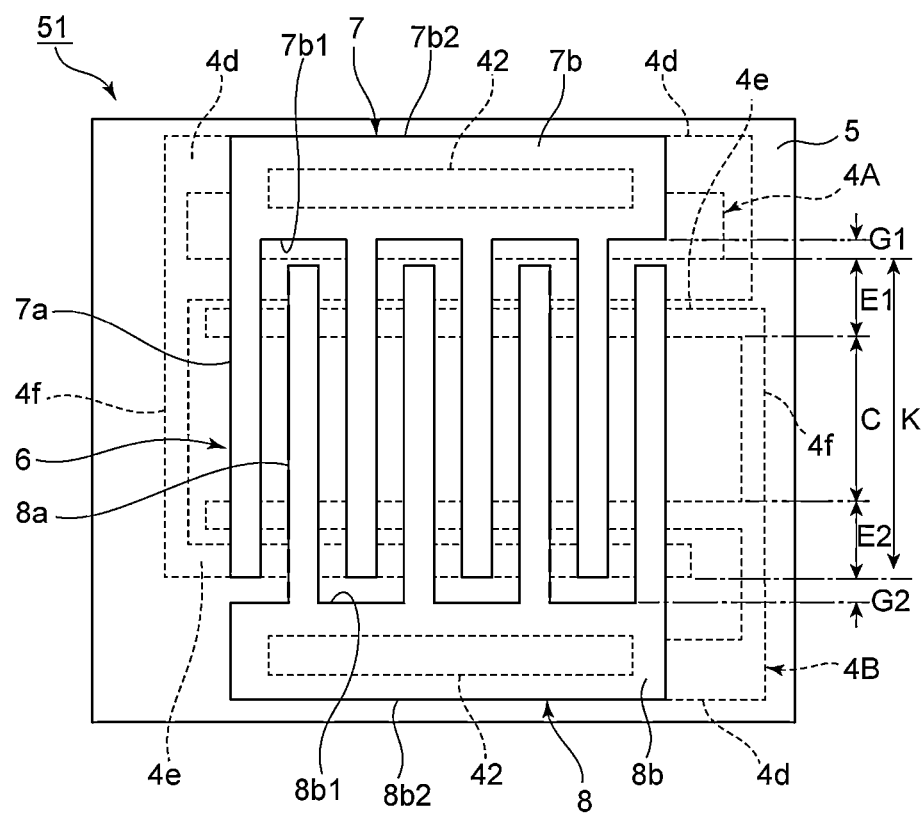
FIG. 10 is a plan view of an acoustic wave device according to a fifth preferred embodiment of the present invention.

FIG. 10 is a plan view of an acoustic wave device according to a fifth preferred embodiment of the present invention. In the acoustic wave device 51 according to the fifth preferred embodiment, the widths of the first portions 4*d* of the first and second conductive layers 4A and 4B, that is, the dimensions in the direction in which the first and second electrode fingers 7*a* and 8*a* extend, are smaller than those in the acoustic wave device 41. As in the acoustic wave device 11 illustrated in FIG. 4, the widths of the first portions 4*d* are smaller than the width of the first busbar 7*b* and the width of the second busbar 8*b*. As described above, the width of the first portion 4*d* need not overlap the entire region of the first busbar 7*b* or the second busbar 8*b* in the direction in which the first and second electrode fingers 7*a* and 8*a* extend. The first portions 4*d* of the first and second conductive layers 4A and 4B may be located on the outer side of the inner-side edge 7*b*1 of the first busbar 7*b* and the inner-side edge 8*b*1 of the second busbar 8*b* with respect to the overlap region K. In addition, the outer-side edges of the first portions 4d of the first and second conductive layers 4A and 4B may also be located on the inner side of the outer-side edge 7b2 of the first busbar 7b and the outer-side edge 8b2 of the second busbar 8b.

The remaining structure of the acoustic wave device 51 is the same as that of the acoustic wave device 41. Accordingly, in the present preferred embodiment as well, the fractional band width can be effectively reduced.

Figure 11:
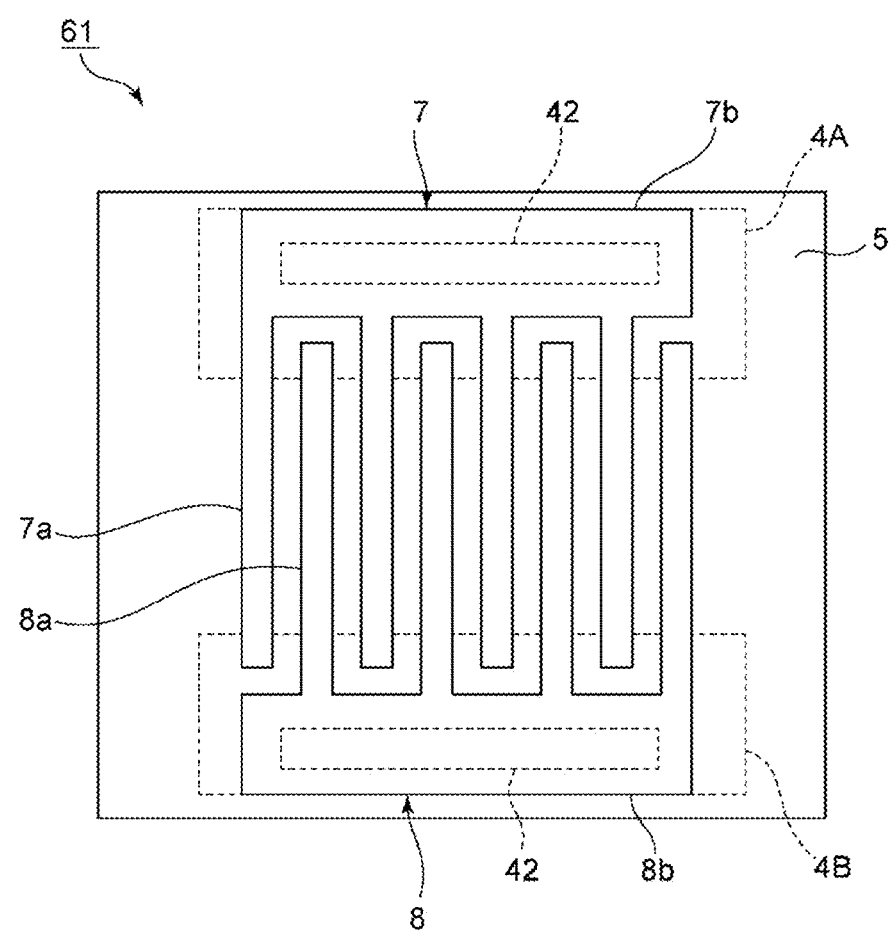
FIG. 11 is a plan view of an acoustic wave device according to a sixth preferred embodiment of the present invention.
Figure 12:
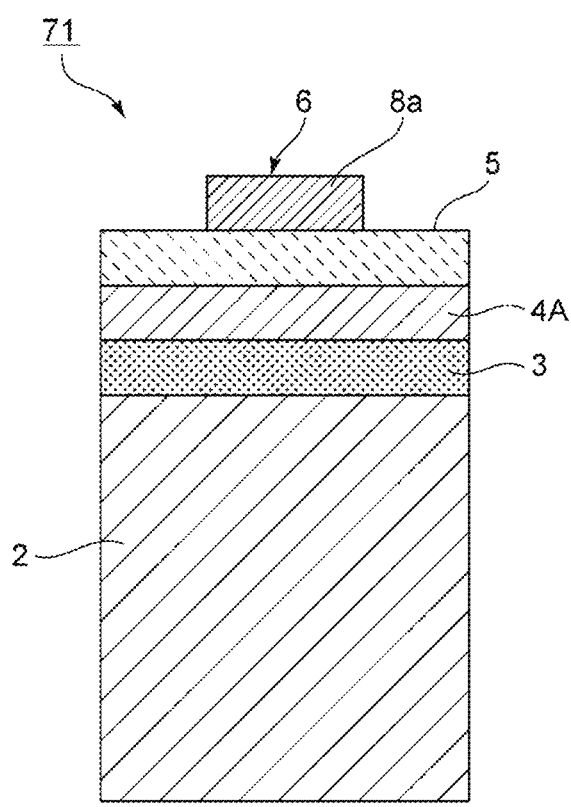
FIG. 12 is a front sectional view of an acoustic wave device according to a seventh preferred embodiment of the present invention.

FIG. 11 is a plan view of an acoustic wave device according to a sixth preferred embodiment of the present invention, and FIG. 12 is a front sectional view of an acoustic wave device according to a seventh preferred embodiment of the present invention. In the acoustic wave device 61, the first busbar 7b and the second busbar 8b are electrically connected to the first and second conductive layers 4A and 4B, respectively, via the through-hole electrode 42. The remaining structure of the acoustic wave device 61 is the same as that of the acoustic wave device 1.

As described above, when the acoustic wave device 61 has the same electrode structure as the acoustic wave device 1 according to the first preferred embodiment, the first conductive layers 4A or second conductive layer 4B may also be electrically connected to the first busbar 7b or the second busbar 8b. In this case as well, in the first edge region E1, a capacitance is generated between the first conductive layer 4A and the second electrode fingers 8a. In addition, in the second edge region E2, a capacitance is generated between the second conductive layer 4B and the first electrode fingers 7a. Accordingly, in the acoustic wave device 61 as well, the fractional band width can be reduced.

In FIG. 1B, the support substrate 2 has a structure in which the high-acoustic-velocity film 2B is laminated on the Si substrate 2A. However, when the support substrate 2 is made of a high-acoustic-velocity material, the high-acoustic-velocity film can be omitted as in the seventh preferred embodiment illustrated in FIG. 12.

In an acoustic wave device 71, the support substrate 2 is a high-acoustic-velocity support substrate made of a high-acoustic-velocity material. Accordingly, the acoustic wave device 71 is the same as the acoustic wave device 1 illustrated in FIG. 1B except that the high-acoustic-velocity film is omitted.

Figure 13:
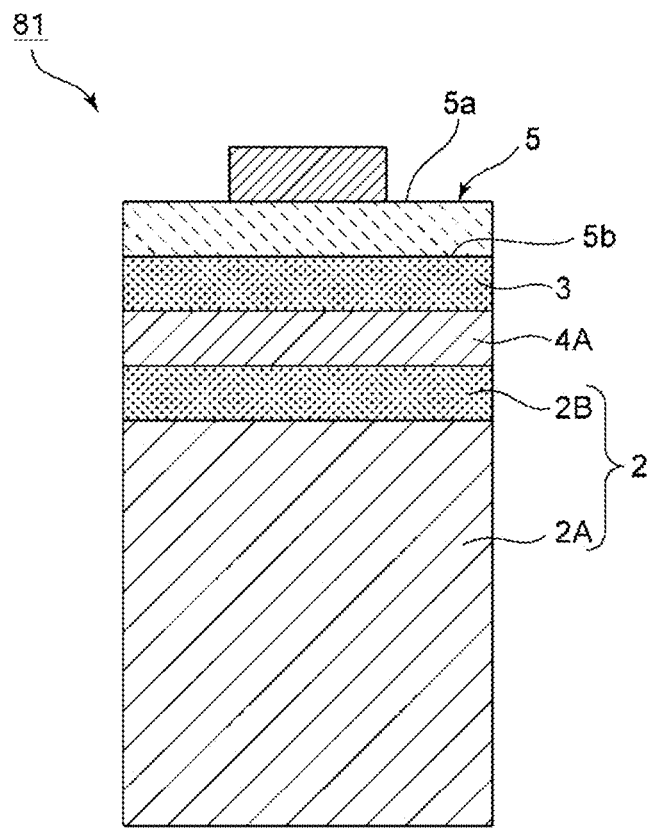
FIG. 13 is a front sectional view for describing an acoustic wave device according to an eighth preferred embodiment of the present invention.

FIG. 13 is a front sectional view for describing an acoustic wave device according to an eighth preferred embodiment of the present invention. FIG. 13 illustrates the portion corresponding to the portion in the first preferred embodiment in FIG. 1B. The acoustic wave device 81 differs from the acoustic wave device 1 in that the first conductive layer 4A does not make direct contact with the second main surface 5b of the piezoelectric layer 5 and is laminated between the low-acoustic-velocity film 3 and the support substrate 2. As described above, the first conductive layer 4A may be indirectly laminated on the piezoelectric layer 5. The remaining structure of the acoustic wave device 81 is the same as that of the acoustic wave device 1.

In a preferred embodiment of the present invention, as described above, the conductive layer may be indirectly laminated on the piezoelectric layer. In this case as well, the fractional band width can be effectively reduced by adding a parallel capacitance.

Figure 14:
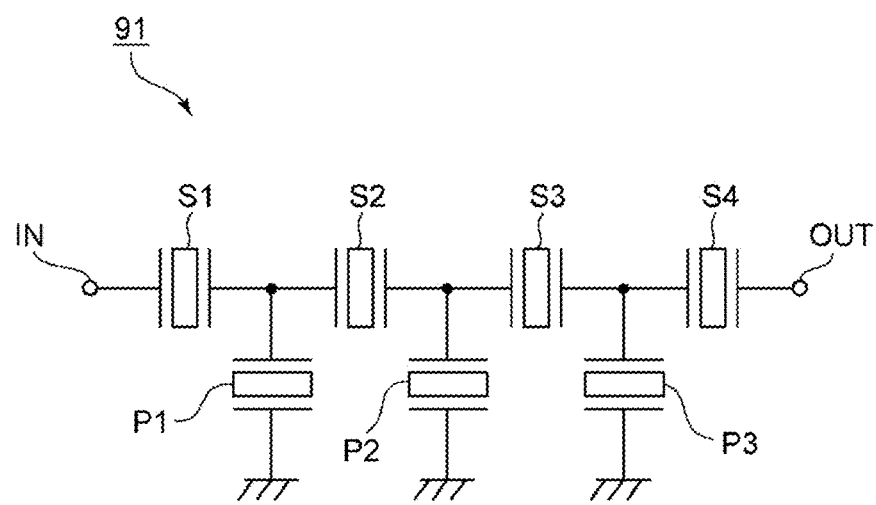
FIG. 14 is a circuit diagram of a ladder filter according to a ninth preferred embodiment of the present invention.

FIG. 14 is a circuit diagram of a ladder filter according to a ninth preferred embodiment of the present invention. In a ladder filter 91, series arm resonators S1 to S4 are connected to each other in serial in a series arm that connects an input terminal IN and an output terminal OUT to each other. In addition, three parallel arm resonators P1 to P3 are connected to three parallel arms, respectively, to connect the series arm and the ground potential to each other.

Figure 15:
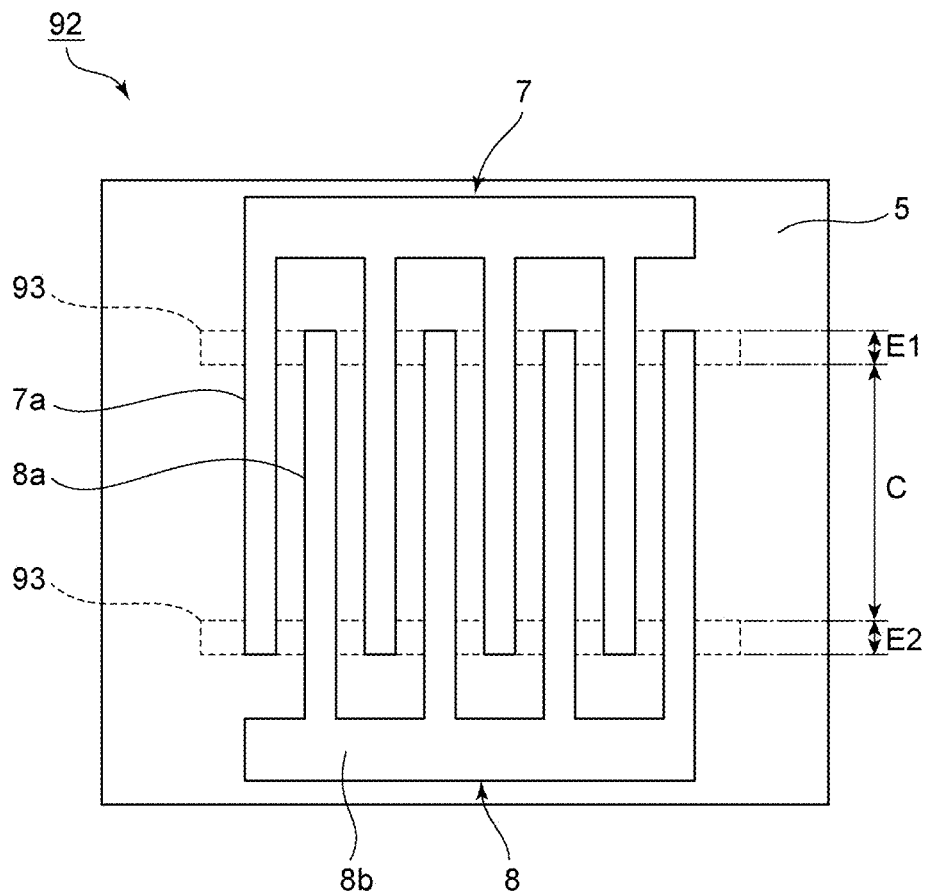
FIG. 15 is a planar sectional view for describing parallel arm resonators used in the ladder filter illustrated in FIG. 14.

In the ladder filter 91, the series arm resonators S1 to S4 have the same structure as the acoustic wave device 1 illustrated in FIG. 1A. In contrast, the parallel arm resonators P1 to P3 have the structure illustrated in FIG. 15. FIG. 15 is a planar sectional view for describing the parallel arm resonators used in the ladder filter described above.

In an acoustic wave device 92, mass addition films 93 and 93 are provided below the piezoelectric layer 5 in the first and second edge regions E1 and E2 as in comparative example 1 described above. The mass addition films 93 are Pt films.

The design parameters of the series arm resonators S1 to S4 and the parallel arm resonators P1 to P3 are the same with the exception of the differences in the structures described above. That is, the structure of the series arm resonators S1 to S4 is the same as that in example 1. The parallel arm resonators P1 to P3 are the same as those in example 1 with the exception of the point described above.

Figure 16:
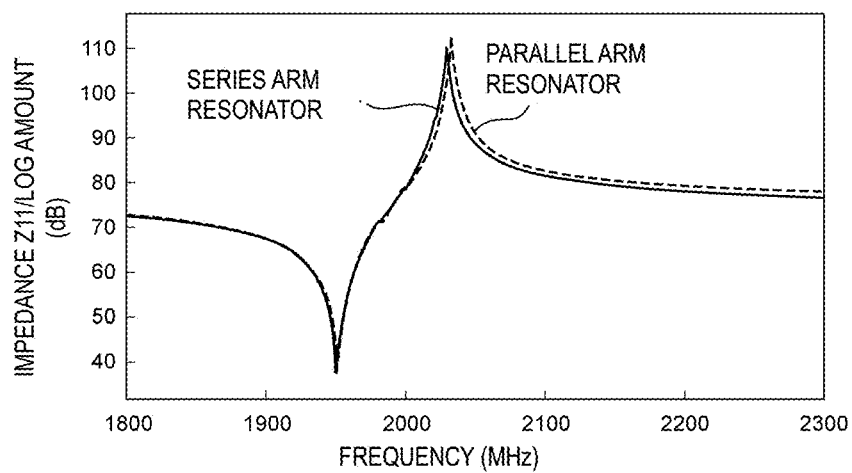
FIG. 16 is a diagram illustrating the impedance-frequency characteristics of series arm resonators and the parallel arm resonators of the ladder filter illustrated in FIG. 14.

FIG. 16 illustrates the impedance-frequency characteristics of the series arm resonators and the parallel arm resonators described above. As is clear from FIG. 16, the fractional band width of the parallel arm resonators is reduced compared with the parallel arm resonators because the series arm resonator includes the acoustic wave device according to a preferred embodiment of the present invention.

In the ladder filter 91, since the series arm resonators S1 to S4 are the acoustic wave devices according to a preferred embodiment of the present invention, the fractional band width of the series arm resonators can be reduced. Accordingly, the steepness on the high frequency side of the passband can be increased.

It should be noted that each of the ladder filters according to preferred embodiments of the present invention preferably includes a plurality of series arm resonators and at least one parallel arm resonator, and the series arm resonators with the lowest resonant frequency among the plurality of series arm resonators includes the acoustic wave device according to a preferred embodiment of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate;
   a piezoelectric layer provided directly or indirectly on the support substrate, the piezoelectric layer including a first main surface and a second main surface that face away from each other, the second main surface being closer to the support substrate; and
   an IDT electrode provided on the first main surface of the piezoelectric layer; wherein
   the IDT electrode includes a first comb electrode including a plurality of first electrode fingers and a first busbar and a second comb electrode including a plurality of second electrode fingers interdigitated with the plurality of first electrode fingers and a second busbar, a region in which the first electrode fingers and the second electrode fingers overlap each other in a direction perpendicular or substantially perpendicular the first electrode fingers and the second electrode fingers is an overlap region, the overlap region includes a middle region located centrally in a direction in which the first electrode fingers and the second electrode fingers extend, a first edge region located on an outer side of the middle region in the direction in which the first electrode fingers and the second electrode fingers extend, the first edge region being closer to the first busbar, and a second edge region located on the outer side of the middle region in the direction in which the first electrode fingers and the second electrode fingers extend, the second edge region being closer to the second busbar, a first gap region is present between the first busbar and the first edge region, a second gap region is present between the second busbar and the second edge region, and the acoustic wave device further includes a conductive layer that is provided on the second main surface of the piezoelectric layer to overlap at least some portions of the first and second edge regions in plan view and at least some portions of the first and second busbars in plan view.

2. The acoustic wave device according to claim 1, wherein the conductive layer includes a first conductive layer including a portion that overlaps at least a portion of the first busbar and a portion that overlaps the first edge region and a second conductive layer including a portion that overlaps at least a portion of the second busbar and a portion that overlaps the second edge region.

3. The acoustic wave device according to claim 2, wherein the first conductive layer further includes a portion that overlaps the second edge region, and the second conductive layer further includes a portion that overlaps the first edge region.

4. The acoustic wave device according to claim 2, wherein the first conductive layer further includes a portion that overlaps the first gap region in plan view, and the second conductive layer further includes a portion that overlaps the second gap region in plan view.

5. The acoustic wave device according to claim 1, wherein the conductive layer is electrically connected to at least one of the first busbar and the second busbar.

6. The acoustic wave device according to claim 1, wherein the conductive layer is not electrically connected to the first busbar and the second busbar.

7. The acoustic wave device according to claim 1, further comprising:
an intermediate layer between the piezoelectric layer and the support substrate.

8. The acoustic wave device according to claim 1, wherein the conductive layer is provided on the second main surface of the piezoelectric layer.

9. The acoustic wave device according to claim 7, wherein the conductive layer is provided either within the intermediate layer or on an interface between the intermediate layer and the support substrate.

10. The acoustic wave device according to claim 9, wherein the intermediate layer includes a low-acoustic-velocity film made of a low-acoustic-velocity material through which a bulk wave propagates at an acoustic velocity lower than an acoustic velocity at which a bulk wave propagates through the piezoelectric layer.

11. The acoustic wave device according to claim 10, wherein the support substrate includes a Si substrate and a high-acoustic-velocity film made of a high-acoustic-velocity material through which a bulk wave propagates at an acoustic velocity higher than an acoustic velocity at which an acoustic wave propagates through the piezoelectric layer.

12. A ladder filter comprising:
at least one series arm resonator; and
at least one parallel arm resonator; wherein
at least one of the at least one series arm resonator includes the acoustic wave device according to claim 1.

13. The ladder filter according to claim 12, wherein the conductive layer includes a first conductive layer including a portion that overlaps at least a portion of the first busbar and a portion that overlaps the first edge region and a second conductive layer including a portion that overlaps at least a portion of the second busbar and a portion that overlaps the second edge region.

14. The ladder filter according to claim 13, wherein the first conductive layer further includes a portion that overlaps the second edge region, and the second conductive layer further includes a portion that overlaps the first edge region.

15. The ladder filter according to claim 13, wherein the first conductive layer further includes a portion that overlaps the first gap region in plan view, and the second conductive layer further includes a portion that overlaps the second gap region in plan view.

16. The ladder filter according to claim 12, wherein the conductive layer is electrically connected to at least one of the first busbar and the second busbar.

17. The ladder filter according to claim 12, wherein the conductive layer is not electrically connected to the first busbar and the second busbar.

18. The ladder filter according to claim 12, further comprising:
an intermediate layer between the piezoelectric layer and the support substrate.

19. The ladder filter according to claim 12, wherein the conductive layer is provided on the second main surface of the piezoelectric layer.

20. A ladder filter comprising:
a plurality of series arm resonators; and
at least one parallel arm resonator; wherein
a series arm resonator including a lowest resonant frequency among the plurality of series arm resonators includes the acoustic wave device according to claim 1.

* * * * *